United States Patent
Park

(10) Patent No.: US 9,813,066 B2
(45) Date of Patent: Nov. 7, 2017

(54) PLC HIGH SPEED COUNTER AND OPERATING METHOD THEREOF

(71) Applicant: LSIS CO., LTD, Gyeonggi-do (KR)

(72) Inventor: Kang-Hee Park, Chungcheongnam-do (KR)

(73) Assignee: LSIS CO., LTD., Gyeonggi-Do (KR)

(*) Notice: Subject to any disclaimer, the term of this patent is extended or adjusted under 35 U.S.C. 154(b) by 46 days.

(21) Appl. No.: 14/927,987

(22) Filed: Oct. 30, 2015

(65) Prior Publication Data

US 2016/0126958 A1    May 5, 2016

(30) Foreign Application Priority Data

Oct. 30, 2014 (KR) .................. 10-2014-0148900

(51) Int. Cl.
*H03K 21/38* (2006.01)
*H03K 21/02* (2006.01)

(52) U.S. Cl.
CPC .......... *H03K 21/026* (2013.01); *H03K 21/38* (2013.01)

(58) Field of Classification Search
CPC .............................. H03K 21/026; H03K 21/38
USPC ..................................................... 377/22–56
See application file for complete search history.

(56) References Cited

U.S. PATENT DOCUMENTS

| | | | |
|---|---|---|---|
| 7,234,159 B1 * | 6/2007 | Fox | G06F 21/76 726/20 |
| 9,052,975 B2 * | 6/2015 | Fukushima | G06F 7/588 |
| 2002/0156819 A1 * | 10/2002 | Oerlemans | H04L 9/0861 708/252 |
| 2004/0264233 A1 * | 12/2004 | Fukushima | G06F 7/588 365/145 |
| 2015/0207511 A1 * | 7/2015 | Dahan | H03K 23/542 377/34 |

* cited by examiner

*Primary Examiner* — Brandon S Cole
(74) *Attorney, Agent, or Firm* — Nath, Goldberg & Meyer; Jerald L. Meyer; Stanley N. Protigal

(57) ABSTRACT

Disclosed herein are a PLC high speed counter and an operating method thereof. The PLC high speed counter includes: an input circuit configured to convert and output a high-speed pulse train input from an encoder into a CMOS level; a micro processor unit configured to receive the pulse train from the input circuit, generate a count value by counting the pulse train in a linear count manner and calculate a current ring count value based on the count value; and a buffer configured to receive the count value from the micro processor unit and store the same as a current linear count value, wherein, when a current value request is received from an external device, the micro processor unit determines an operation mode and transmits, if the operation mode is a ring counter mode, the current ring count value.

5 Claims, 7 Drawing Sheets

(a)

(b)

PLC HIGH SPEED COUNTER AND OPERATING METHOD THEREOF

CROSS REFERENCE TO RELAATED APPLICATION

This application claims the benefit of Korean Patent Application No. 10-2014-0148900, filed on Oct. 30, 2014, entitled "PLC HIGH SPEED COUNTER AND OPERATING METHOD THEREOF", which is hereby incorporated by reference in its entirety into this application.

TECHNICAL FIELD

The present disclosure relates to a PLC high speed counter, and more particularly, a PLC high speed counter capable of minimizing interrupt load to a microprocessor and improving performance by calculating a current value in a ring counter mode of the PLC high speed counter through a current value and an equation in a linear counter mode, and an operating method thereof.

BACKGROUND ART

A programmable logic controller (PLC) is a module for counting a high-speed pulse train such as signals from a pulse generator or an encoder which cannot be processed with a typical counter command.

In general, to operate the PLC high speed counter, a mode for the PLC high speed counter is established using a device such as a PC or HMI. In this case, the PLC high speed counter operates in the linear counter mode or ring counter mode depending on the established mode.

In the established mode, the PLC high speed counter counts a high-speed pulse train input from the encoder and then stores the current value.

When the PLC high speed counter is in the ring counter mode, the PLC high speed counter counts the pulse train such that the count value is between a minimum ring count value and the maximum ring count value, which are set by the user, and then stores the current value.

When the PLC high speed counter is in the linear counter mode, the PLC high speed counter counts the pulse train such that the count value is within a count range, and then stores the current value.

A PC or an HMI reads the current value from the PLC high speed counter and displays the same on the screen to inform the user of the present count value (a currently counted value).

FIG. 1 illustrates a process of counting a current value according to a counter mode of the PLC high speed counter when the maximum count range is signed 32 bits.

(a) in the FIG. 1 illustrates a process of counting a current value in the linear counter mode of the PLC high speed counter.

When a pulse train is input to the PLC high speed counter, the PLC high speed counter adds a current value according to an addition condition. Once the current value reaches the upper limit (2,147,483,647) of the count range, the PLC high speed counter does not perform addition anymore even if an addition condition is triggered.

On the other hand, once the current value reaches the lower limit (−2,147,483,647) of the count range after the PLC high speed counter subtracts current values according to a subtraction condition, the PLC high speed counter does not perform subtraction anymore even if a subtraction condition is triggered.

(b) in the FIG. 1 illustrates a process of counting a current value in the ring counter mode of the PLC high speed counter. When the PLC high speed counter operates in the ring counter mode, the user sets the maximum ring count value and the minimum ring count value.

When a pulse train is input to the PLC high speed counter, the PLC high speed counter adds or subtracts a current value according to the addition condition or subtraction condition.

In this case, at the moment the current value reaches the maximum ring count value after the PLC high speed counter adds current values, a Carry is triggered and the current value is changed to the minimum ring count value. Thereafter, the PLC high speed counter performs addition when an addition condition is triggered.

On the other hand, at the moment a current value reaches the minimum ring count value after the PLC high speed counter subtracts current values, a Borrow is triggered and the current value is changed to the maximum ring count value. Thereafter, the PLC high speed counter performs subtraction when a subtraction condition is triggered.

FIG. 2 is a flowchart illustrating count processing of a PLC high speed counter according to the conventional art.

When a pulse train is input to the PLC high speed counter, the PLC high speed counter pauses a PLC scan program, generates an interrupt and performs a count process routine every time the PLC high speed counter senses a rising edge and a falling edge.

In this case, as shown in FIG. 2, the PLC high speed counter determines whether the counter mode is the linear counter mode or the ring counter mode in the interrupt routine every time a pulse train is input. Thereby, the PLC high speed counter performs branching to implement addition, subtraction or ring count.

Accordingly, in conventional cases, a high speed counter function needs to be performed after an interrupt is triggered at each edge of an input pulse train, and a complex branching process should be performed according to the count mode as shown in FIG. 2. Thereby, a long time is taken to process interrupts.

Thereby, when a high-speed pulse train is input, resources of the MPU of the PLC high speed counter are excessively occupied to process interrupts and accordingly the processing speed of the PLC scan program is lowered.

In addition, when a pulse train is input through multiple high speed counter channels simultaneously, an input pulse may fail to be counted.

Furthermore, branching of the process routine is necessary for respective counts, and therefore software capacity increases, a long time is taken to perform writing, and the software is difficult to be maintained.

DISCLOSURE

Technical Problem

An object of the present disclosure devised to solve the problems is to provide a PLC high speed counter capable of minimizing interrupt load to a microprocessor and improving performance by calculating a current value in a ring counter mode of the PLC high speed counter through a current value and an equation for the linear counter mode, and an operating method thereof.

Technical Solution

In accordance with an aspect of the present disclosure, the above and other objects can be accomplished by the provision of an operating method of a programmable logic controller (PLC) high speed counter including counting, when the pulse is input, the pulse in a linear count manner and generating account value, storing the count value in a buffer as a current linear count value, determining, when a current value request is input from the external device, a mode of the PLC high speed counter, and transmitting, when the mode of the PLC high speed counter is determined to be a ring counter mode as a result of the determining, a current ring count value corresponding to the current linear count value to the external device.

The method further includes calculating the current ring count value based on the count value and storing the same in the buffer before performing the determining of the mode of the PLC high speed counter.

Herein, the transmitting of the current ring count value may include transmitting the current ring count value stored in the buffer to the external device.

In addition, the transmitting of the current ring count value may include calculating, after performing the determining of the mode of the PLC high speed counter, the current ring count value based on the count value stored in the buffer as the current linear count value and transmitting the calculated current ring count value to the external device.

The current ring count value may be calculated by the following equation:

$$\text{Current ring count value} = \text{Count value} - \text{FLOOR}\left(\frac{\text{Count value} - RING_{MIN}}{RING_{MAX} - RING_{MIN}}\right) \times (RING_{MAX} - RING_{MIN}) \quad \text{Equation}$$

Herein, $RING_{MAX}$ denotes a maximum ring count value, $RING_{MIN}$ denotes a minimum ring count value, and FLOOR( ) denotes a FLOOR function.

The method may further include transmitting, when the mode of the PLC high speed counter is a linear counter mode as a result of the determining, the current linear count value stored in the buffer to the external device.

Advantageous Effects

Conventionally, different processes are branched and performed according to modes of the PLC high speed counter. In contrast, according to embodiments of the present disclosure, a current value in the ring counter mode of the PLC high speed counter is calculated three a current value and denigration in the linear counter mode.

Accordingly, one process is performed in any modes of the PLC high speed counter. Therefore, unnecessary branching operation is eliminated and interrupt processing time may be reduced.

In addition, the conventional PLC high speed counter has a problem of increasing the software capacity and the processing time since different branch processes are performed according to modes of the PLC high speed counter. In contrast, according to embodiments of the present disclosure, only a short interrupt process is performed and a current ring count value needs to be calculated in a corresponding equation only when there is a request for the current value from an external device. Therefore, performance degradation and increase of execution time for a PLC scan program, which result from overload, may be prevented.

DESCRIPTION OF DRAWINGS

The above and other objects, features and other advantages of the present disclosure will be more clearly understood from the following detailed description taken in conjunction with the accompanying drawings, in which.

BEST MODE

Figure 1:
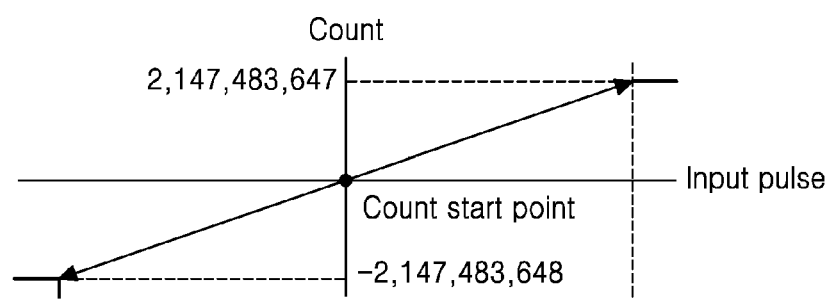
FIG. 1 illustrates processes of counting a current value according to counter modes of a conventional PLC high speed counter.
Figure 1:
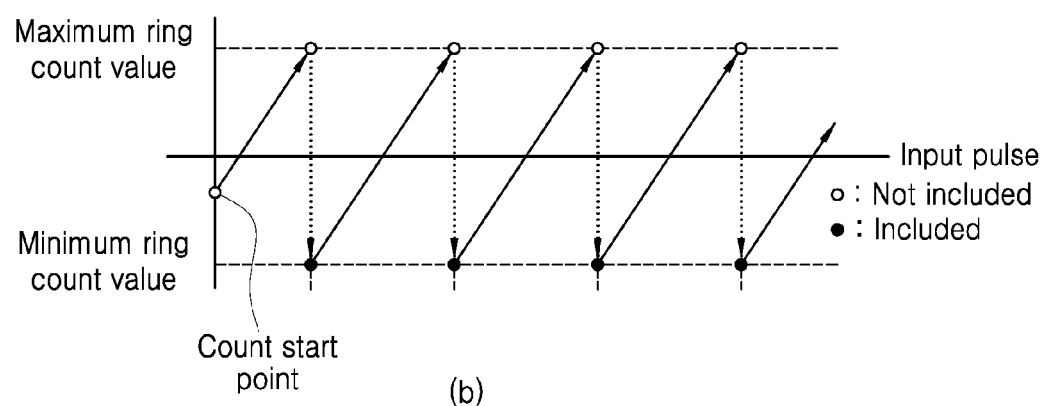
Figure 2:
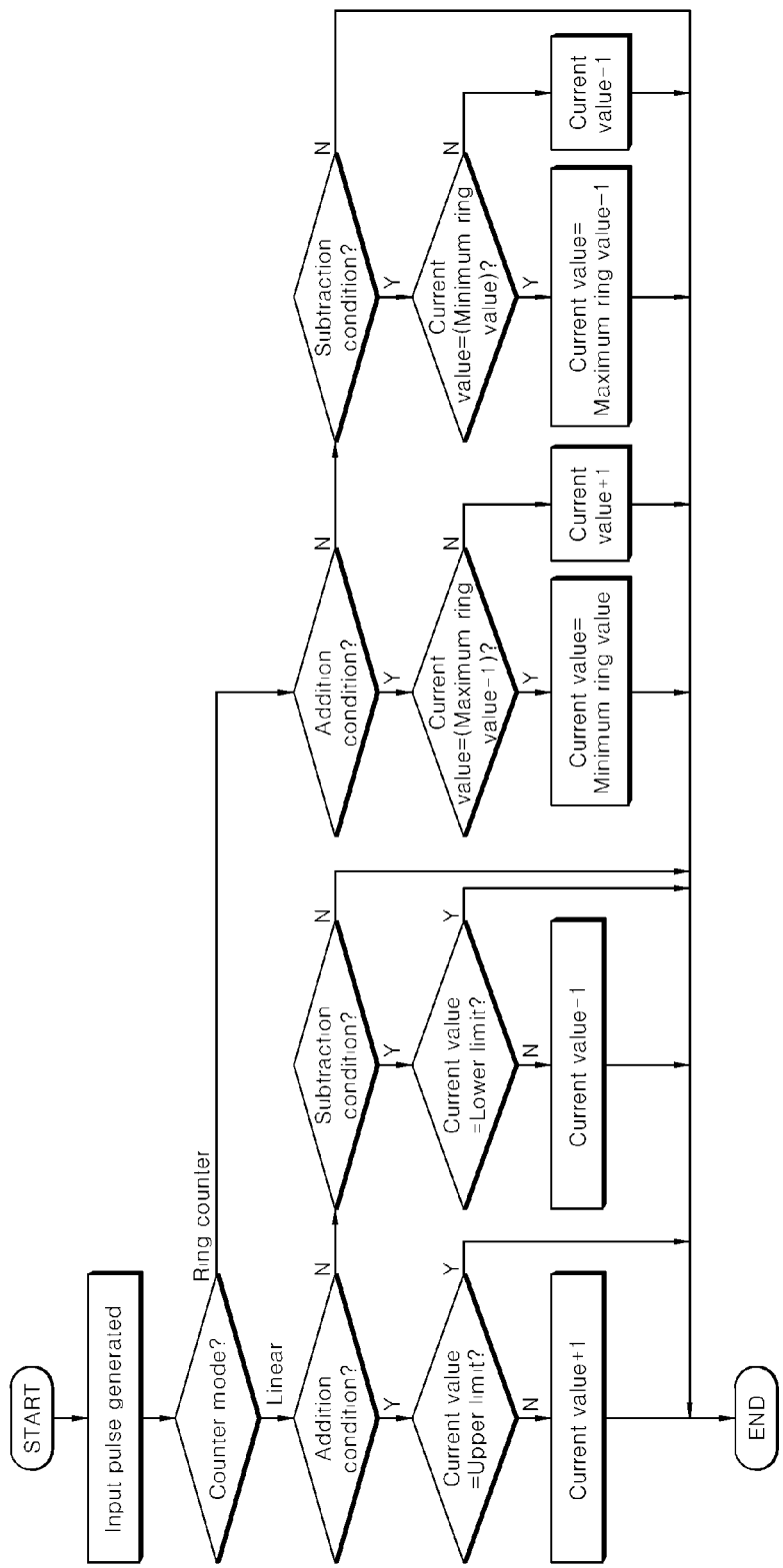
FIG. 2 is a flowchart illustrating a count process of a conventional PLC high speed counter.

Advantages and features of the present disclosure and methods to achieve them will become apparent from the descriptions of exemplary embodiments herein below with reference to the accompanying drawings. However, the present disclosure is not limited to the exemplary embodiments disclosed herein but may be implemented in various different forms. The exemplary embodiments are provided to make the description of the present disclosure thorough and to fully convey the scope of the present disclosure to those skilled in the art. It is to be noted that the scope of the present disclosure is defined only by the claims. Like reference numerals denote like elements throughout the descriptions.

In describing embodiments of the present disclosure, a detailed description of well-known functions and constituents will be omitted if it is determined that such description can unnecessarily obscure the main points of the present invention. In addition, terms which will be used below are defined in consideration of the functions of the corresponding elements in the present invention. The definitions of the terms may vary depending on intention of a user, a precedent case, or the like. Therefore, the terms should be defined based on the entire specification.

Hereinafter, a detailed description will be given of the structure and operation of a PLC high speed counter according to embodiments of the present disclosure with reference to the accompanying drawings.

Figure 3:
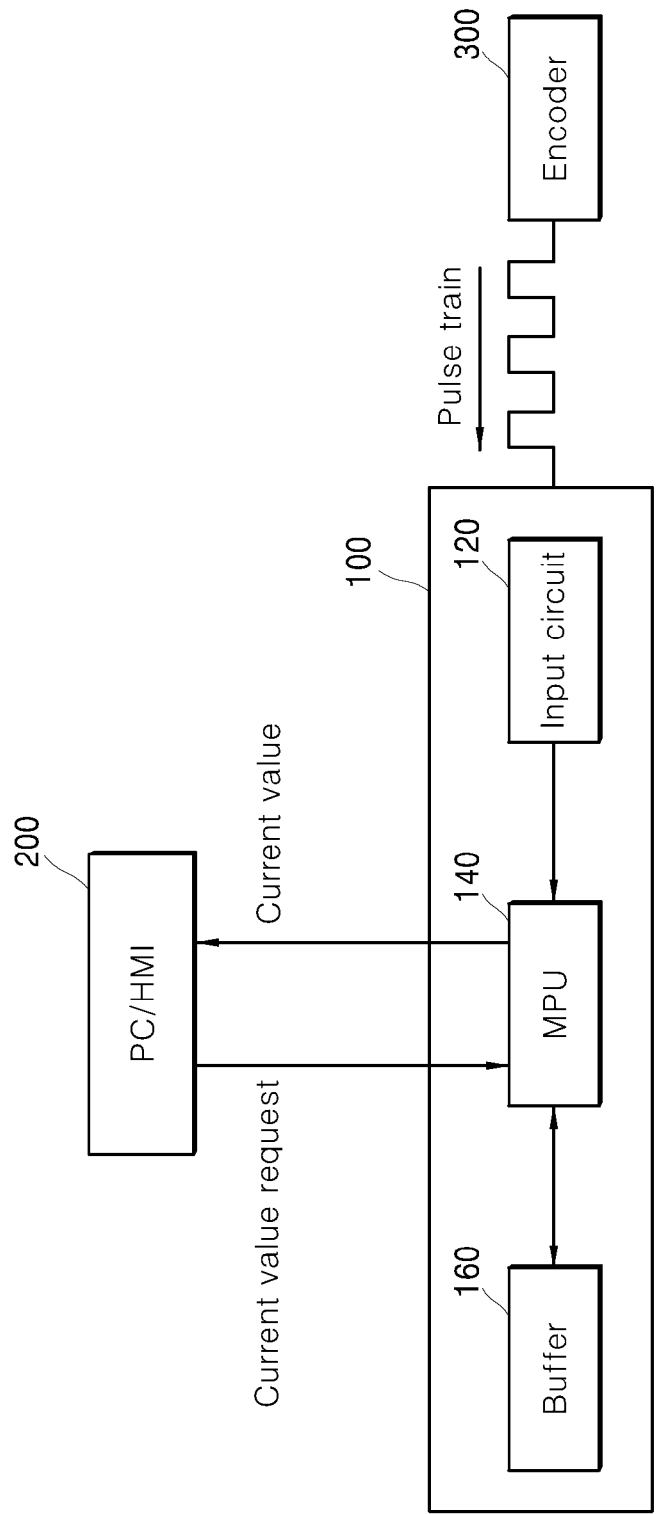
FIG. 3 is a block diagram illustrating a PLC high speed counter according to an embodiment of the present disclosure.

FIG. 3 is a block diagram illustrating a PLC high speed counter according to an embodiment of the present disclosure.

Referring to FIG. 3, a PLC high speed counter 100 counts a high-speed pulse train input from an encoder 300 and stores a count result ("count value") as a current value. Upon receiving a request for the current value from an external device 200, the PLC high speed counter 100 may transmit the stored current value to the external device 200.

The external device 200 sets an operation mode of the PLC high speed counter 100, a minimum ring count value, a maximum ring count value, a count range in the linear counter mode ("linear count range").

Herein, the external device 200 sets the PLC high speed counter 100 to the ring counter mode or the linear counter mode, and the maximum ring count value and the minimum ring count value are used to calculate a current ring count value.

In addition, the external device 200 requests and receives the current value from the PLC high speed counter 100 and then displays the same using a display device such that the user can check the current value.

The external device 200 and the encoder 300 are common technologies in the art and thus a detailed description thereof will be omitted. Hereinafter, configuration of the PLC high speed culture 100 will be described in detail.

The PLC high speed counter 100 may include an input circuit 120, a micro processor unit (MPU) 140, and a buffer 160.

The input circuit 120 converts a high-speed pulse train input from the encoder 300 into a CMOS level and delivers the level to the MPU 140. Herein, the user can implement the input circuit 120 by properly selecting elements which are well known in the art, and therefore a detailed description of the circuit 120 will be omitted.

The MPU 140 counts the pulse train delivered from the input circuit 120 in the linear count manner and transmits a count result ("count value") to the buffer 160.

Hereinafter, the count value calculated in the linear count manner and stored in the buffer 160 will be defined as "a current linear count value". In this specification, the term "count value" has the same meaning as "current linear count value".

The MPU 140 may be configured to calculate a current ring count value using the count value in Equation 1, which will be described later, and to transmit the calculated ring count value to the buffer 160.

When the MPU 140 receives an input for requesting the current value from the external device 200, the MPU 140 determines whether the established mode is the ring counter mode or the linear counter mode. If the mode is the ring counter mode, the MPU 140 transmits the current ring count value to the external device 200. If the mode is the linear counter mode, the MPU 140 transmits the current linear count value to the external device 200.

Optionally, when the MPU 140 receives an input for requesting the current value from the external device 200, the MPU 140 determines whether the established mode is the ring counter mode or the linear counter mode. If the mode is the linear counter mode, the MPU 140 may transmit the current linear count value stored in the buffer 162 to the external device 200. If the mode is the ring counter mode, the MPU 140 may calculate a current ring count value by applying the current linear count value (count value) stored in the buffer 160 to Equation 1, and then transmit the calculated ring count value to the external device 200.

That is, while the conventional PLC high speed counter in the ring counter mode calculates a pulse train in the ring count manner, a PLC high speed counter according to the present disclosure does not use the ring count manner, but uses the linear count manner and an equation to count a current value in the ring counter mode. Details of operation of the MPU 140 will be described later with reference to FIGS. 4 to 7.

The buffer 160 stores the count value (current linear count value) and the current ring count value transmitted from the MPU 140. Herein, the user can implement the buffer 160 by properly selecting elements well known in the art, and thus a detailed description thereof will not be given.

Figure 4:
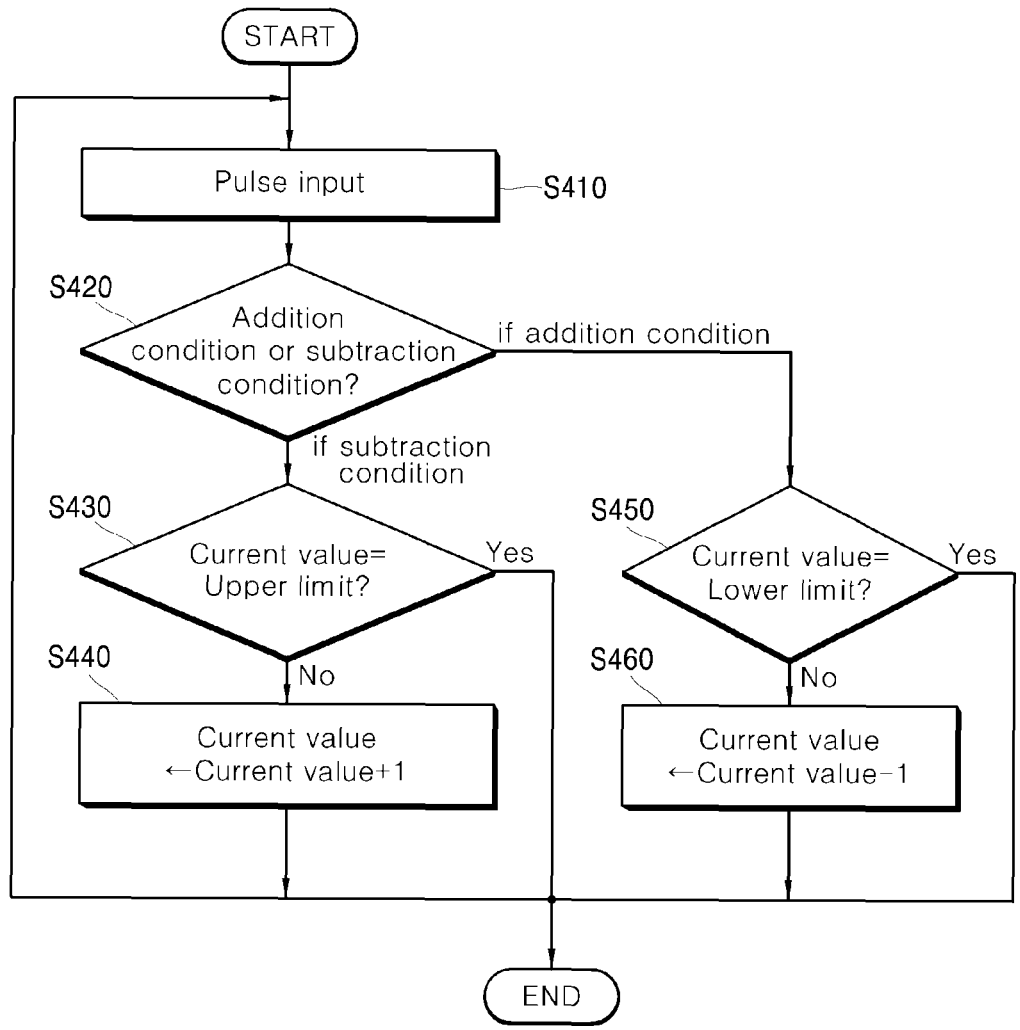
FIG. 4 is a flowchart illustrating a counter process of a PLC high speed counter according to a first embodiment of the present disclosure.

FIG. 4 is a flowchart illustrating a counter process of a PLC high speed counter according to a first embodiment of the present disclosure.

Referring to FIG. 4, when a pulse is input from the encoder 300 (S410), the PLC high speed counter 100 determines whether the current state corresponds to the addition condition or the subtraction collision (S420).

If the addition condition is satisfied as a result of determination in step S420, the PLC high speed counter 100 determines whether the current linear count value stored in the buffer 160 is the upper limit of the established linear count range (S430).

If the current linear count value is the upper limit (S430-Yes), counting is terminated. If the current linear count value is not the upper limit (S430-No), the current linear count value is increased by 1 (S440). Herein, the current linear count value increased by 1 is stored in the buffer 160.

If the subtraction condition is satisfied as a result of determination in step S420, the PLC high speed counter 100 determines whether the current linear count value stored in the buffer 160 is the lower limit of the established linear count range (S450).

If the current linear count value is the lower limit (S450-Yes), counting is terminated. If the current linear count value is not the lower limit (S450-No), the current linear count value is reduced by 1 (S460). Herein, the current linear count value reduced by 1 is stored in the buffer 160.

FIG. 4 illustrates a counting process for a single pulse, which is performed every time a pulse is input.

Meanwhile, if a signal for requesting the current value is input from the external device 200 after or during counting of a pulse train in steps S410 to S460, the PLC high speed counter 100 transmits the current value to the external device 200. The process of transmitting the current value will be specifically described with reference to FIG. 5.

Figure 5:
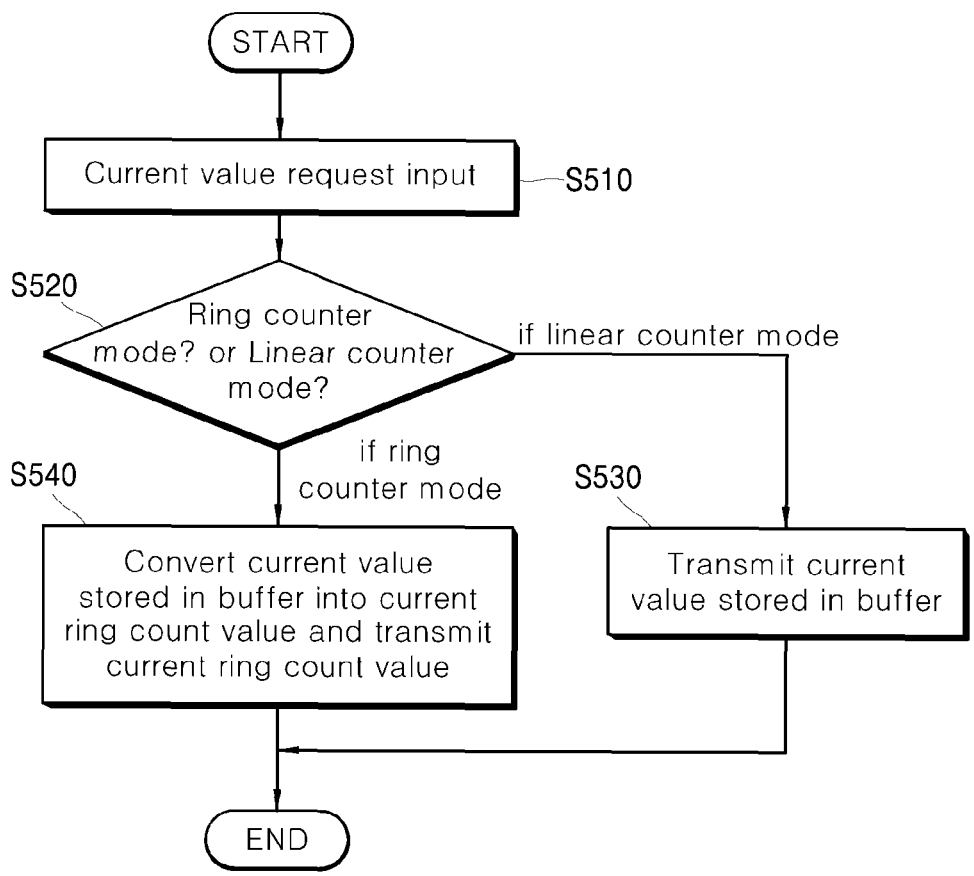
FIG. 5 is a flowchart illustrating a process of transmitting a current value of the PLC high speed counter according to the first embodiment of the present disclosure.

FIG. 5 is a flowchart illustrating a process of transmitting a current value of the PLC high speed counter according to the first embodiment of the present disclosure.

Referring to FIG. 5, when an input for requesting a current value is received from the external device 200 (S510), the PLC high speed counter 100 determines whether the established mode is the linear counter mode or the ring counter mode (S520).

If the mode is the linear counter mode as a result of determination in step S520, the PLC high speed counter 100 transmits the current linear count value stored in the buffer 160 to the external device 200 (S530).

If the mode is the ring counter mode as a result of determination in step S520, the PLC high speed counter 100 applies the current linear count value (count value) stored in the buffer 160 to Equation 1 and transmits a calculated result ("current ring count value") to the external device 200 (S540).

$$\text{Current ring count value} = \text{Count value} - \text{FLOOR}\left(\frac{\text{Count value} - RING_{MIN}}{RING_{MAX} - RING_{MIN}}\right) \times (RING_{MAX} - RING_{MIN}) \quad \text{Equation 1}$$

Herein, the count value denotes a value calculated in the linear count manner ("a current linear count value"), $RING_{MAX}$ denotes the maximum ring count value, $RING_{MIN}$ denotes the minimum ring count value, and FLOOR( ) denotes the function FLOOR.

In other words, in the embodiment illustrated in FIG. 5, a current ring count value is calculated using the current linear count value after the mode of the PLC high speed counter 100 is determined. Thereby, the number of times of calculation of the current ring count value may be reduced, and thus load to the PLC high-speed counter may also be reduced.

Table 1 given below exemplarily shows conversion of count values calculated in the linear count manner ("current linear count values") into current ring count values using the PLC high speed counter of the present disclosure. It is assumed that the minimum ring count value $RING_{MIN}$ is −1000, and the maximum ring count value $RING_{MAX}$ is 1000.

TABLE 1

| Case | Count value | ① Count value − $RING_{MIN}$ | $RING_{MAX}$ − $RING_{MIN}$ | FLOOR ( ) | □ × □ | Current ring count value |
|---|---|---|---|---|---|---|
| Addition | 9000 | 19000 | 20000 | 0 | 0 | 9000 |
|  | 9999 | 19999 | 20000 | 0 | 0 | 9999 |
|  | 10000 | 20000 | 20000 | 1 | 20000 | −10000 |
|  | 19000 | 29000 | 20000 | 1 | 20000 | −1000 |
|  | 20000 | 30000 | 20000 | 1 | 20000 | 0 |
| Subtraction | −9000 | 1000 | 20000 | 0 | 0 | −9000 |
|  | −10000 | 0 | 20000 | 0 | 0 | −10000 |
|  | −10001 | −1 | 20000 | −1 | −20000 | 9999 |
|  | −20000 | −10000 | 20000 | −1 | −20000 | 0 |
|  | 20000 | 30000 | 20000 | −1 | −20000 | 0 |

In conventional cases, different processes are performed according to the modes of the PLC high speed counter. In contrast, according to embodiments of the present disclosure, the PLC high speed counter calculates a current value for the ring counter mode through a current value and an equation for the linear counter mode.

Accordingly, one process is performed in any modes of the PLC high speed counter, and thus unnecessary branching operation may be eliminated and interrupt processing time may be reduced.

In addition, a conventional PLC high speed counter has a problem of increasing the software capacity and the processing time since different branch processes are performed according to modes of the PLC high speed counter. In contrast, according to embodiments of the present disclosure, only a short interrupt process is performed and a current ring count value needs to be calculated in a corresponding equation only when there is a request for the current value from an external device. Therefore, performance degradation and increase of execution time for a PLC scan program, which result from overload, may be prevented.

Figure 6:
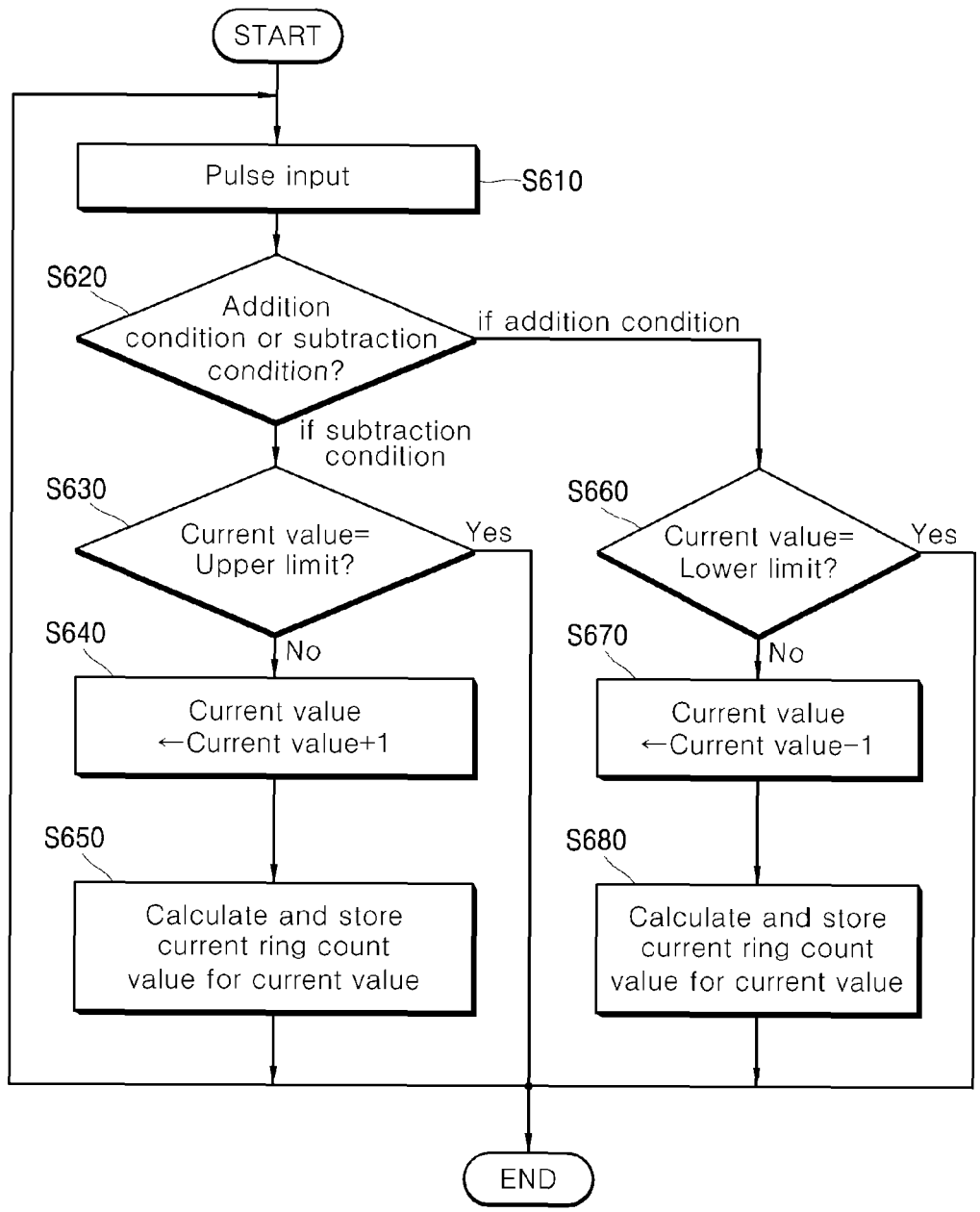
FIG. 6 is a flowchart illustrating a count process of a PLC high speed counter according to a second embodiment of the present disclosure.

FIG. 6 is a flowchart illustrating a count process of a PLC high speed counter according to a second embodiment of the present disclosure.

Referring to FIG. 6, when a pulse is input from the encoder 300 (S610), the PLC high speed counter 100 determines whether the current state corresponds to the addition condition or the subtraction collision (S620).

If the addition condition is satisfied as a result of determination in step S620, the PLC high speed counter 100 determines whether the current linear count value stored in the buffer 160 is the upper limit of the established linear count range (S630).

If the current linear count value is the upper limit (S630-Yes), counting is terminated. If the current linear count value is not the upper limit (S630-No), the current linear count value is increased by 1 (S640), and the current linear count value increased by 1 is stored in the buffer 160.

After the current linear count value stored in the buffer 160 is increased by 1 according to step S640, the current linear count value (=Count value) is applied to Equation 1 to calculate a current ring count value. The calculated current ring count value is stored in the buffer 160 (S650).

If the subtraction condition is satisfied as a result of determination in step S620, the PLC high speed counter 100 determines whether the current linear count value stored in the buffer 160 is the lower limit of the established linear count range (S660).

If the current linear count value is the lower limit (S660-Yes), counting is terminated. If the current linear count value is not the lower limit (S660-No), the current linear count value is reduced by 1 (S670), and the current linear count value reduced by 1 is stored in the buffer 160.

After the current linear count value stored in the buffer 160 is reduced by 1 according to step S670, the current linear count value (=Count value) is applied to Equation 1 to calculate a current ring count value. The calculated current ring count value is stored in the buffer 160 (S680).

That is, in the embodiment illustrated in FIG. 6, the current ring count value is calculated and stored before determination of the mode of the PLC high speed counter 100 is performed. Thereby, the stored current ring count value may be quickly transmitted to the external device of 200 when a signal for requesting the current value is received from the external device 200.

Meanwhile, if a signal for requesting the current value is input from the external device 200 after or during counting of a pulse train in steps S610 to S680, the PLC high speed counter 100 transmits the current value to the external device 200. The process of transmitting the current value will be specifically described with reference to FIG. 7.

Figure 7:
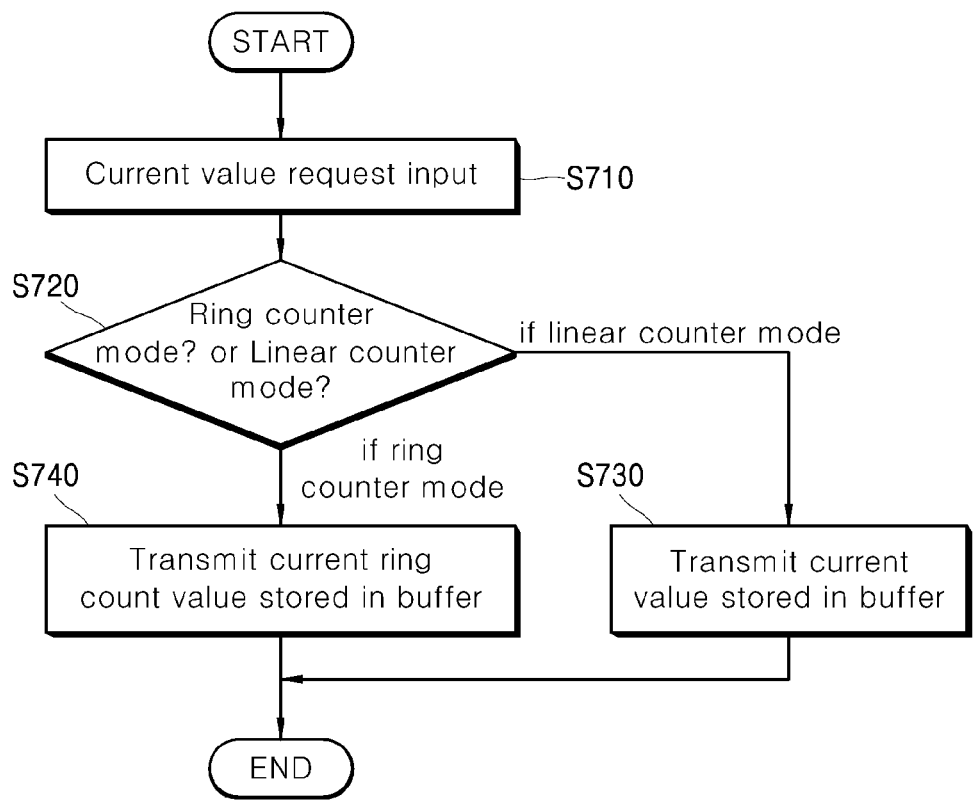
FIG. 7 is a flowchart illustrating a process of transmitting a current value of the PLC high speed counter according to the second embodiment of the present disclosure.

FIG. 7 is a flowchart illustrating a process of transmitting a current value of the PLC high speed counter according to the second embodiment of the present disclosure.

Referring to FIG. 7, when an input for requesting the current value is received from the external device 200 (S710), the PLC high speed counter 100 determines whether the established mode is the linear counter mode or the ring counter mode (S720).

If the mode is the linear counter mode as a result of determination in step S720, the PLC high speed counter 100 transmits the current linear count value stored in the buffer 160 to the external device 200 (S730).

If the mode is the ring counter mode as a result of determination in step S720, the PLC high speed counter 100 transmits the current ring count value stored in the buffer 160 to the external device 200 (S740).

A PLC high speed counter and an operating method thereof according to exemplary embodiments of the present disclosure have been described in detail above with reference to the accompanying drawings. Those skilled in the art will appreciate that the present disclosure is not limited to the exemplary embodiments, and various substitutions, modifications and variations are possible without departing from the spirit or scope of the disclosure.

Accordingly, the exemplary embodiments described herein and the accompanying drawings are not intended to limit the scope of the present disclosure. The technical idea of the present disclosure is not limited by the exemplary embodiments and the accompanying drawings. The scope of protection sought by the present disclosure should be determined by the appended claims and their legal equivalents, and all changes coming within the meaning and equivalency range of the appended claims are intended to be embraced therein.

The invention claimed is:

1. An operating method of a programmable logic controller (PLC) high speed counter configured to count a pulse and transmit a generated count value to an external device, the method comprising:
 counting, when the pulse is input, the pulse in a linear count manner and generating a count value;
 storing the count value in a buffer as a current linear count value;
 determining, when a current value request is input from the external device, a mode of the PLC high speed counter; and
 transmitting, when the mode of the PLC high speed counter is determined to be a ring counter mode as a result of the determining, a current ring count value to the external device,
 wherein the current ring count value is calculated by the following $$\text{Current ring count value} = \text{Count value} - \text{FLOOR}\left(\frac{\text{Count value} - RING_{MIN}}{RING_{MAX} - RING_{MIN}}\right) \times (RING_{MAX} - RING_{MIN}) \quad \text{equation}$$

wherein $RING_{MAX}$ denotes a maximum ring count value, $RING_{MIN}$ denotes a minimum ring count value, and FLOOR( ) denotes a FLOOR function.

2. The method according to claim 1, further comprising: calculating the current ring count value based on the count value and storing the same in the buffer before performing the determining of the mode of the PLC high speed counter.

3. The method according to claim 2, wherein the transmitting of the current ring count value comprises: transmitting the current ring count value stored in the buffer to the external device.

4. The method according to claim 1, wherein the transmitting of the current ring count value comprises: calculating, after performing the determining of the mode of the PLC high speed counter, the current ring count value based on the count value stored in the buffer as the current linear count value and transmitting the calculated current ring count value to the external device.

5. The method according to claim 1, further comprising: transmitting, when the mode of the PLC high speed counter is a linear counter mode as a result of the determining, the current linear count value stored in the buffer to the external device.

* * * * *